United States Patent [19]

Pai

[11] Patent Number: 5,734,475
[45] Date of Patent: Mar. 31, 1998

[54] PROCESS OF MEASURING COPLANARITY OF CIRCUIT PADS AND/OR GRID ARRAYS

[75] Inventor: Deepak K. Pai, Burnsville, Minn.

[73] Assignee: Ceridian Corporation, Minneapolis, Minn.

[21] Appl. No.: 730,096

[22] Filed: Oct. 15, 1996

[51] Int. Cl.$^6$ ............................................. G01B 11/30
[52] U.S. Cl. ....................... 356/375; 356/371; 356/237; 356/376
[58] Field of Search ....................... 356/375, 371, 356/237, 376

[56] References Cited

U.S. PATENT DOCUMENTS

| | | | |
|---|---|---|---|
| 4,282,456 | 8/1981 | Stein | 313/419 |
| 4,343,553 | 8/1982 | Nakagawa et al. | 356/376 |
| 4,688,939 | 8/1987 | Ray | 356/237 |
| 4,801,065 | 1/1989 | Colquitt et al. | 228/19 |
| 5,455,870 | 10/1995 | Sepai et al. | 382/147 |
| 5,465,152 | 11/1995 | Bilodeau et al. | 356/371 |
| 5,526,204 | 6/1996 | French et al. | 360/97.02 |

*Primary Examiner*—Frank G. Font
*Assistant Examiner*—Reginald A. Ratliff
*Attorney, Agent, or Firm*—Kinney & Lange, P.A.

[57] ABSTRACT

A process of measuring coplanarity of an array of conductive elements on a circuit device is disclosed. Light is impinged from a reference plane onto an element of the array at a predetermined angle of incidence. Light is also impinged from the reference plane onto a reflective feature on a measurement plane determined by three points of the circuit device having highest elevations from a base of the circuit device, at the same predetermined angle of incidence. A response of the light impinged onto the element of the array and the reflective feature on the measurement plane is measured to determine coplanarity of the array.

16 Claims, 4 Drawing Sheets

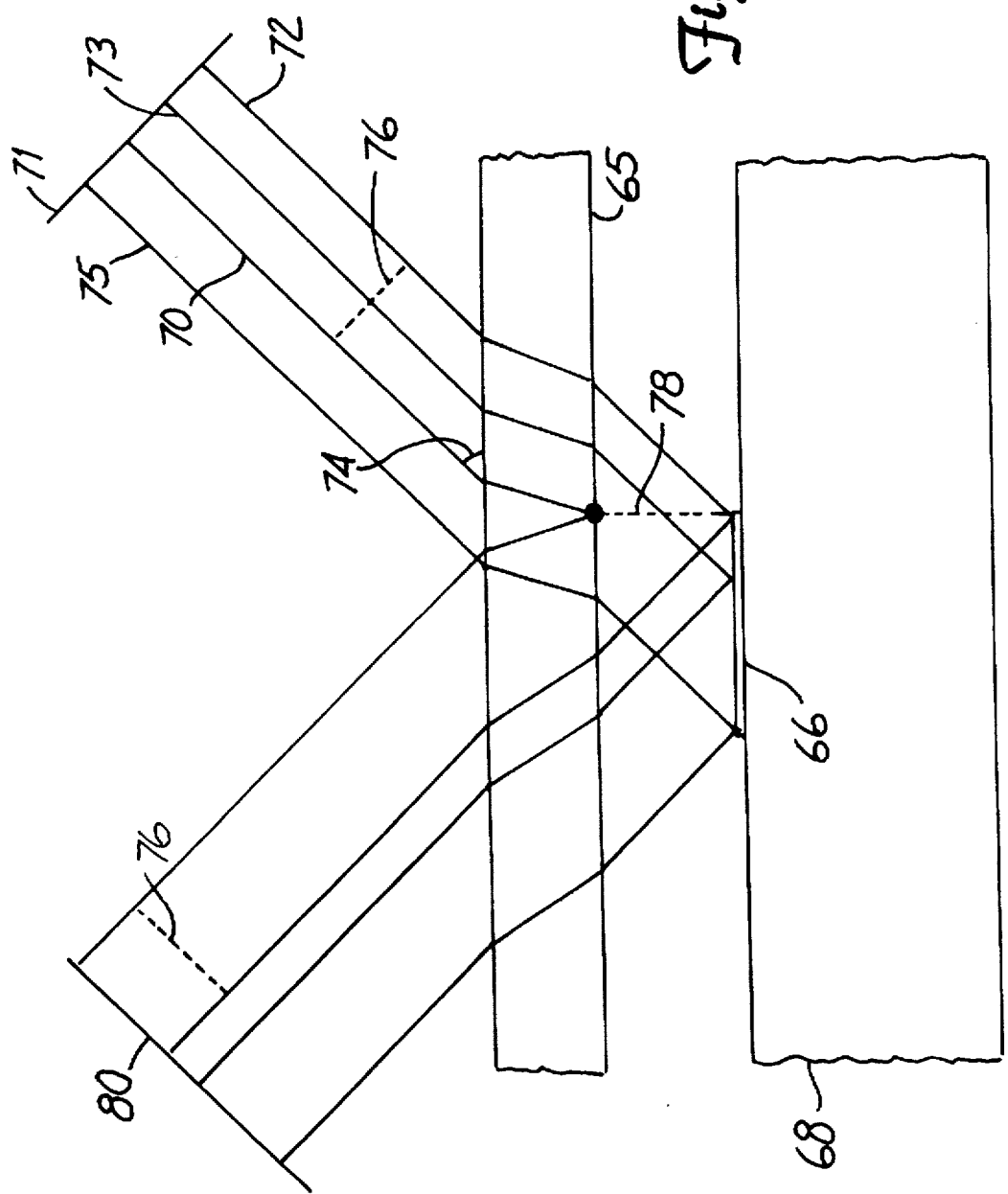

PROCESS OF MEASURING COPLANARITY OF CIRCUIT PADS AND/OR GRID ARRAYS

BACKGROUND OF THE INVENTION

The present invention relates generally to measuring coplanarity of a circuit assembly, and more particularly to a process of measuring coplanarity of a pad pattern or grid array in a large, densely populated printed wiring board or component.

New techniques are constantly being developed to increase the density of population of components in a circuit assembly, one of which is known as land grid array technology. Land grid array components are a class of surface mounted components that employ a grid array of solder connections on a surface of the component. The grid array is not limited to the edges of the component, but instead is disbursed across the surface in spaced relation in an area array, usually uniform. Land grid array components include ball grid array (BGA) components, solder grid array components and column grid array components. The surface bearing the land grid array is positioned to confront an identical grid array of circuit pads on a circuit board, and the soldered beads, balls or columns are heated to reflow to attach or detach the component from the circuit board. These surface mounting techniques significantly increase the density of components in a circuit assembly.

Coplanarity of the grid array and of the pads is an important quality of a densely packed circuit assembly. Coplanarity is generally defined as the difference in elevation between the highest and lowest points of a circuit assembly. Where a circuit assembly is connected to another device such as a motherboard, it is desirable that the pads and grid array be as coplanar as possible, since the points of connection to the motherboard are in a single plane. High values of coplanarity difference indicate that some connection points between the circuit assembly and the motherboard will either be less securely attached or even leave gaps between the circuit assembly and the motherboard at some points of intended connection. It is therefore important to measure the coplanarity of a circuit assembly before connection to a motherboard takes place.

The increased density realized by land grid array technology makes measuring coplanarity at a point of connection extremely difficult, since conventional measuring devices cannot be used within the small space between connection points on the grid array. In such a densely packed configuration, coplanarity is approximated by conventional techniques by measuring the relative elevation of the corners of the circuit assembly, and approximating an overall coplanarity for the circuit assembly therefrom. This method cannot determine coplanarity at a point on the circuit assembly, and does not typically yield accurate results.

X-ray equipment can be used for measuring coplanarity over a small area in a device, but this method also does not measure coplanarity at a given point within the circuit assembly, and is very expensive. Therefore, there is a need for an effective, accurate, and inexpensive method to measure the coplanarity of a densely packed circuit assembly at a point on the circuit assembly.

SUMMARY OF THE INVENTION

In accordance with the present invention, coplanarity of an array of conductive elements on a circuit device is measured by impinging light from a reference plane onto an element of the array at a predetermined angle of incidence and by impinging light from the reference plane onto a reflective feature on a measurement plane determined by three points of the circuit device having highest elevations from a base of the circuit device, at the predetermined angle of incidence. A response of the light impinged onto the element of the array and the reflective feature on the measurement plane is measured to determine coplanarity of the array.

In one embodiment, the response of the light impinged onto the element of the array and the reflective feature on the measurement plane is measured by measuring a first distance between the reference plane and the element of the array. A second distance between the reference plane and the reflective feature on the plane is measured and the second distance is subtracted from the first distance. More particularly, according to this first embodiment coplanarity of an array of conductive elements on a circuit device is measured by placing a plate composed of reflective portions and translucent portions on the array of conductive elements on the circuit device. A first distance is measured from a reference plane to an element of the array through a translucent portion of the plate. A second distance is measured from the reference plane to a reflective portion of the plate, and the second distance is subtracted from the first distance.

In another embodiment, the response of the light impinged on the element of the array and the reflective feature on the measurement plane is measured by detecting at a target reflections of the light impinged onto the element of the array and of the light impinged onto the reflective feature on the measurement plane. The distance between the reflection of the light impinged onto the element of the array and the reflection of the light impinged onto the reflective feature on the measurement plane is measured at the target. That measured distance is divided by the cosine of the angle of incidence. More particularly, according to this second embodiment, coplanarity of an array of conductive elements on a circuit device is measured by impinging a first light beam at a predetermined angle of incidence from a reference plane onto an element of the array on the circuit device. A second light beam is impinged on a reflective feature on a plane determined by three points of the circuit device having highest elevations from a base of the circuit device at the predetermined angle of incidence from the reference plane. Reflections of the first and second light beams are detected at a target, and the distance between the reflections of the first and second light beams is measured at the target. The resulting distance between the reflections of the first and second light beams is divided by the cosine of the angle of incidence.

BRIEF DESCRIPTION OF THE DRAWINGS

FIG. 10 is a section view, as in FIG. 9, showing details of the light paths used to determine coplanarity.

DETAILED DESCRIPTION OF THE PREFERRED EMBODIMENTS

Figure 1:
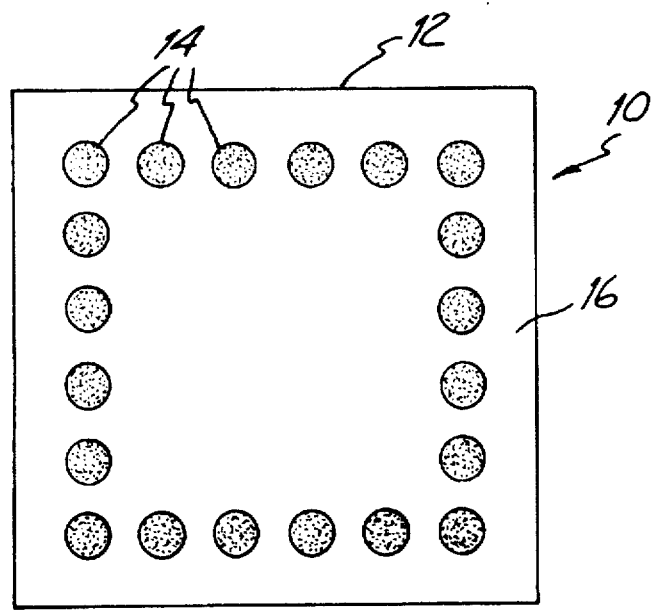
FIG. 1 is a top view of a glass plate having reflective features for use in the process of the present invention.
Figure 2:
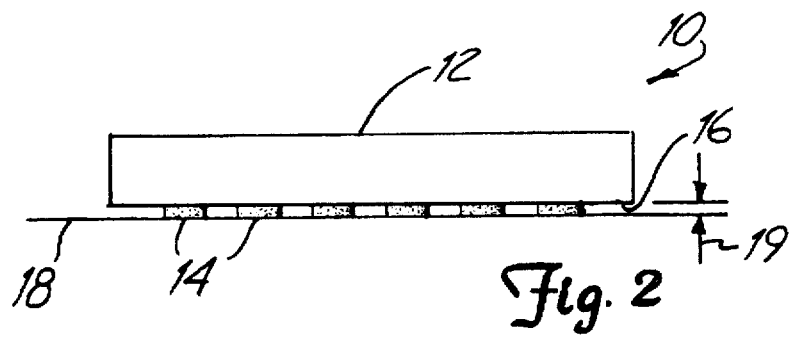
FIG. 2 is a side view of the glass plate shown in FIG. 1.

FIGS. 1 and 2 illustrate a measurement apparatus for measuring coplanarity of a circuit assembly in accordance with the process of the present invention. Apparatus 10 comprises a plate 12 composed of non-reflective, translucent material such as glass, with reflective features 14 formed on surface 16 thereof. Reflective features 14 may, for example, be formed by sputtering 1000 Å thick copper over 500 Å thick layers of titanium (or another reflective material) at the desired feature locations on the flat glass measurement plane of surface 16. Titanium is implemented to reflect light, while copper provides protection and reference points for the features in the masking process. Features 14 are all equal in thickness, preferably as thin as practical, thereby assuring that features 14 form a flat plane 18 parallel to measurement plane surface 16 and that the distance 19 between plane 18 and measurement plane surface 16 is negligible for coplanarity measurement purposes.

Figure 3:
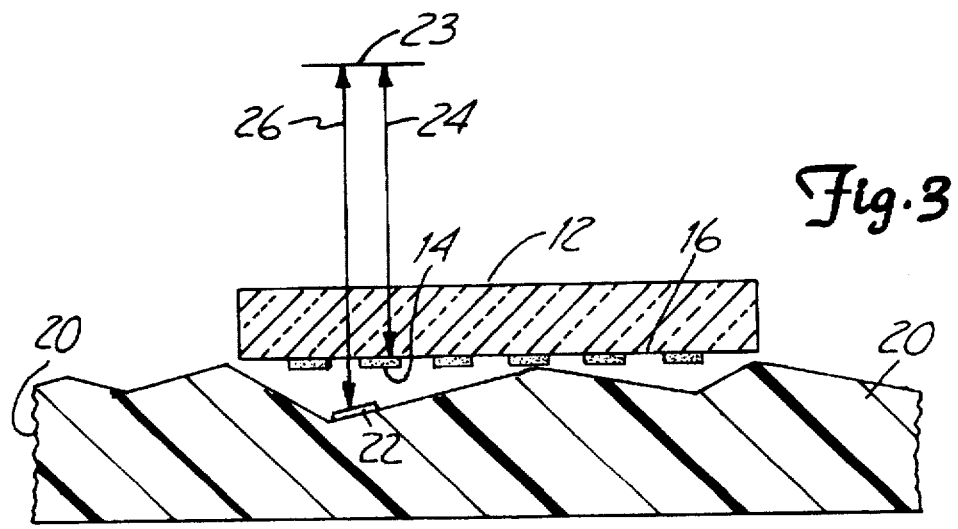
FIG. 3 is a section view of the glass plate shown in FIGS. 1 and 2 illustrating the process of measuring coplanarity of circuit pads according to the present invention.

As shown in FIG. 3, glass plate 12 is placed on printed wiring board 20, supported by at least three points on printed wiring board 20. This is the case because plane 18 of apparatus 10 is defined by a minimum of three points. The printed wiring board 20 includes conductive pads 22 which, because they are metallic, are reflective of light. Standard non-contact height measuring equipment (not shown) implements a coherent light source that directs light to perpendicularly intersect a reflective surface to be measured, thereby measuring its elevation. Such equipment measures the height 24 from reference plane 23 of the equipment to the titanium layer of reflective feature 14 at measurement plane surface 16 of glass plate 12, and the height 26 from reference plane 23 to the top of reflective pad 22 on printed wiring board 20. It is preferred that feature 14 be selected as that feature closest to the pad 22 under test to minimize the space between the parallel measurement paths 24 and 26. The difference between height 26 and height 24 represents the coplanarity difference of printed wiring board 20 at the pad 22 under test, plus the thickness of features 14 (which is preferably small enough to be negligible). This measurement is repeated for other pads 22 on printed wiring board 20 using different reflective features 14 located on glass plate 12. The coplanarity of printed wiring board 20 is defined as the distance between its highest and lowest points. Thus, the coplanarity of board 20 is the greatest measurement of coplanarity difference measured at the pads 22.

Figure 4:
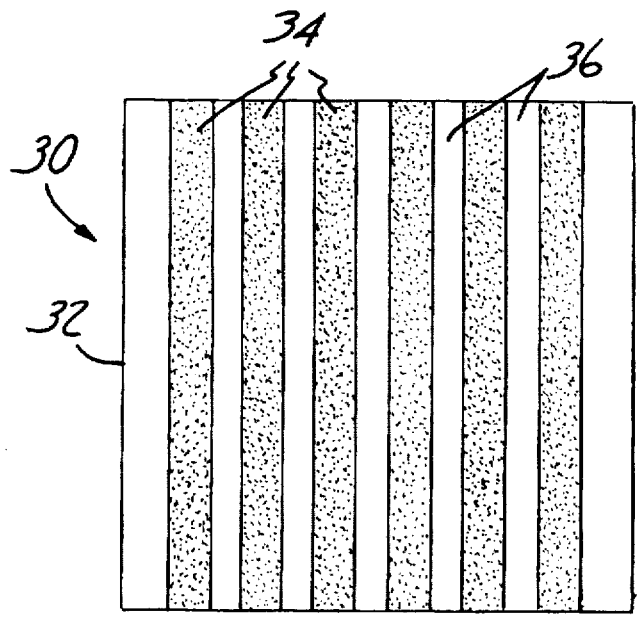
FIG. 4 is a top view of a modified glass plate with reflective stripes for use in the process of the present invention.
Figure 5:
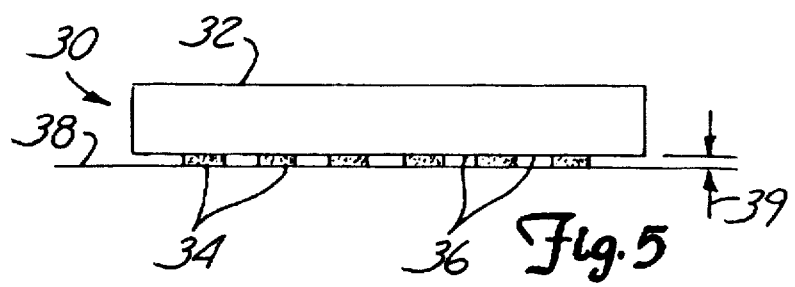
FIG. 5 is a side view of the glass plate shown in FIG. 4.

FIGS. 4 and 5 show a modification, wherein the measurement apparatus 30 used to measure coplanarity is a flat plate 32 composed of non-reflective translucent material such as glass, having reflective stripes 34 formed on surface 36 thereof. Reflective stripes 34 may, for example, have the same width as the width of pads on a circuit assembly to be measured. Reflective stripes 34 may be formed, for example, by sputtering 1000 Å thick layers of copper on 500 Å thick layers of titanium (or another reflective material) at the desired stripe locations on the flat glass measurement plane of surface 36. Stripes 34 are all of equal thickness, preferably as thin as possible, thereby assuring that the stripes 34 form a flat plane 38 parallel to measurement plane surface 36 and that the distance 39 between plane 38 and measurement plane surface 36 is negligible for coplanarity measurement purposes.

Figure 6:
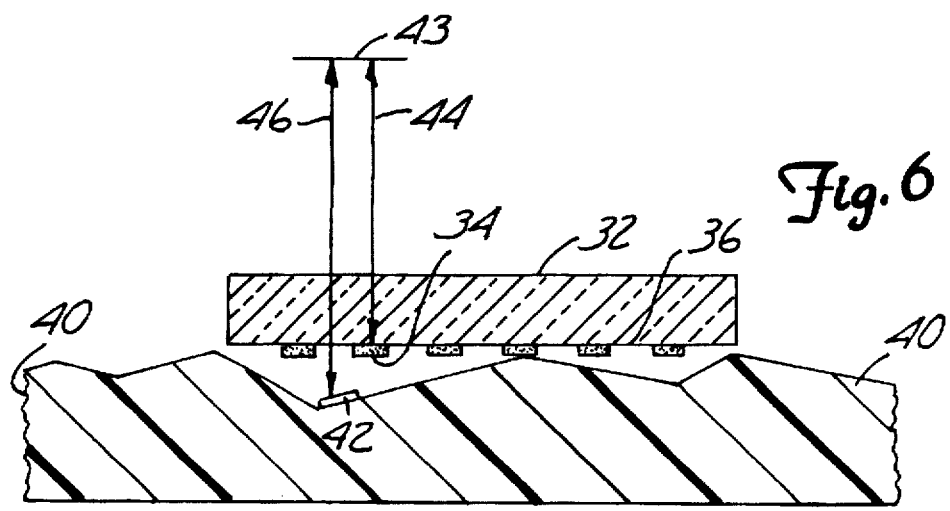
FIG. 6 is a section view of the glass plate shown in FIGS. 4 and 5 illustrating the process of measuring coplanarity of circuit pads according to the present invention.

As shown in FIG. 6, glass plate 32 is placed on a printed wiring board 40, supported by at least three points of printed wiring board 40 because the plane 38 of stripes 34 on glass plate 32 is defined by a minimum of three points. Standard non-contact height measuring equipment (not shown) implementing a coherent light source measures the height 44 from reference plane 43 of the equipment to the titanium layer of reflective stripe 34 at measurement plane surface 36 of glass plate 32, and the height 46 from reference plane 43 to the top of reflective pad 42 on printed wiring board 40. It is preferred that stripe 34 be selected as that stripe closest to the pad 42 under test to minimize the space between the parallel measurement paths 44 and 46. The difference between height 46 and height 44 represents the coplanarity difference of printed wiring board 40 at the pad 42 under test, plus the thickness of stripes 34 (which is preferably small enough to be negligible). This measurement is repeated for other pads 42 on printed wiring board 40 using different reflective stripes 34 located on glass plate 32. The coplanarity of printed wiring board 40 is defined as the distance between its highest and lowest points. Thus, the coplanarity is determined by the greatest measurement of coplanarity difference measured at the pads 42.

Figure 7:
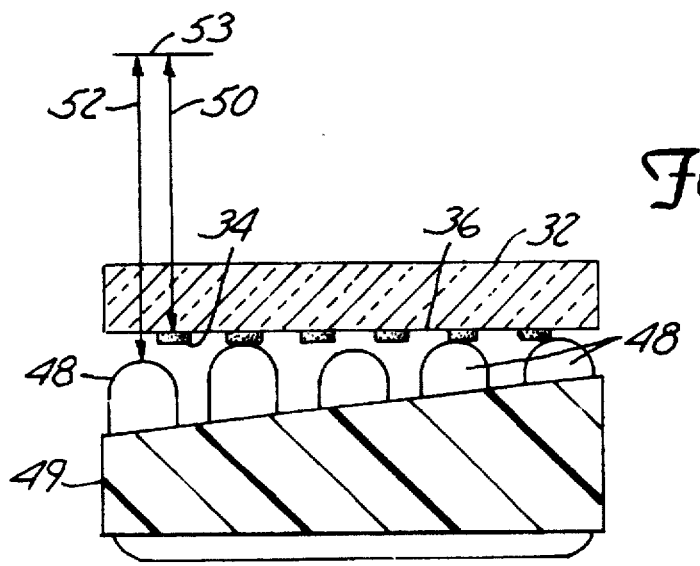
FIG. 7 is a section view of the glass plate shown in FIGS. 4 and 5 illustrating the process of measuring coplanarity of elements of a ball grid array package according to the present invention.

As shown in FIG. 7, glass plate 32 is placed on a ball grid array package 49, with solder balls 48 supporting the glass plate 32 on a plane defined by a minimum of three points of solder balls 48. It is to be understood that solder balls 48 may be any equivalent surface mounting joints, such as solder columns or posts, and are reflective in nature. Standard non-contact height measuring equipment (not shown) implementing a coherent light source measures the height 50 from the reference plane 53 of the equipment to the titanium layer of reflective stripe 34 at measurement plane surface 36 of glass plate 32, and the height 52 from reference plane 53 to the top of solder ball 48 on BGA package 49. It is preferred that feature 34 be selected as that feature closest to the solder ball 48 under test to minimize the space between the parallel measurement paths 50 and 52. The difference between height 52 and height 50 represents the coplanarity difference of BGA package 49 at the solder ball 48 under test, plus the thickness of stripes 34 (which is preferably small enough to be negligible). This measurement is repeated for other solder balls 48 on BGA package 49 using different reflective features 34 located on glass plate 32. The coplanarity of BGA package 49 is defined as the distance between its highest and lowest points. Thus, the coplanarity is determined by the greatest measurement of coplanarity difference measured at the solder balls 48.

Figure 8:
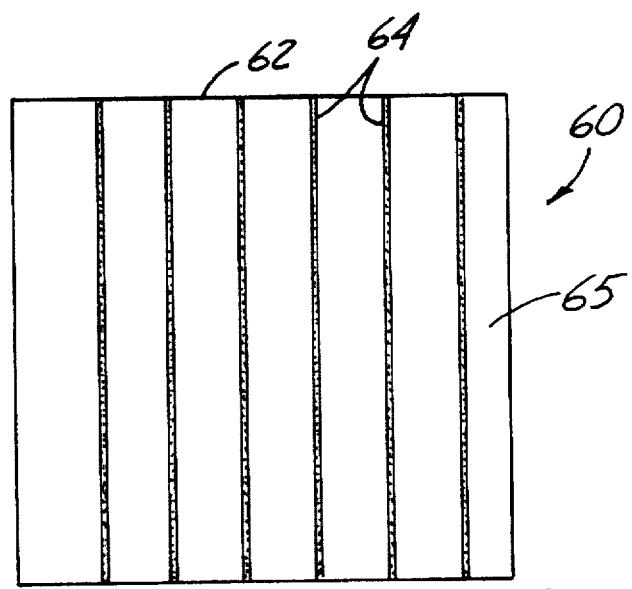
FIG. 8 is a top view of another modified glass plate with reflective lines etched therein for use in the process of the present invention.

FIG. 8 shows an apparatus 60 for measuring coplanarity which is a plate 62 composed of a non-reflective, translucent material such as glass, having lines 64 etched thereon. Lines 64 are etched to a uniform depth from a measurement plane of surface 65 of plate 62, and may for example be 0.001 to 0.003 inches wide. Etched lines 64 form a different reflective pattern distinct from surface 65, enabling use of the lines 64 for reference measurements. Alternatively lines 64 may be plated with a thin layer of titanium to enhance their reflectivity.

Figure 9:
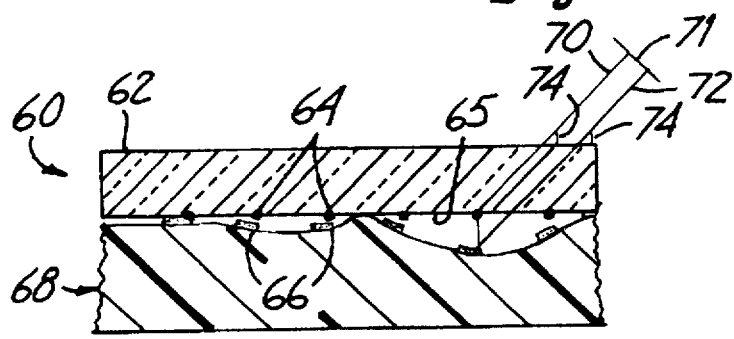
FIG. 9 is a section view of the glass plate shown in FIG. 8 illustrating the process of measuring coplanarity of circuit pads according to a modification of the present invention.

As shown in FIG. 9, glass plate 62 with etched lines 64 is placed on printed wiring board 68, with lines 64 positioned above pads 66 on printed wiring board 68. Glass plate 62 is supported by at least three points of printed wiring board 68, since the measurement plane surface 65 of plate 62 is defined by at least three points. Light path 70 extends from reference plane 71 and impinges upon line 64 on measurement plane surface 65 at a known angle of incidence 74. Light path 72 extends from reference plane 71 to a pad 66 located directly below the line 64 that was impinged upon by the first light path 70, at the same known angle of incidence 74. This measurement scheme is shown in greater detail in FIG. 10. First light path 70 is refracted through glass plate 62 to line 64 on measurement plane surface 65. Light 70 is reflected at line 64 and eventually impinges upon target 80. Second light path 72 is refracted through glass plate 62 and is reflected by pad 66 back through glass plate 62, eventually impinging upon target 80. Light paths 73 and 75 are also refracted through glass plate 62 and reflected from pad 66 back through glass plate 62 to eventually impinge upon target 80. Paths 72, 73 and 75 form an image of pad 66 on target 80, separated from the image of line 64 provided by light path 70. The distance 76 separating light path 72 at the edge of the image of pad 66 and light path 70 at the image of line 64 is measured at target 80. The distance 78 between line 64 and pad 66, representing the coplanarity difference of printed wiring board 68 at the pad 66 under test, can be determined as a function of distance 76 between light paths 70 and 72, according to the following equation:

$$\text{Coplanarity difference} = \frac{\text{distance between measuring lines}}{\text{cosine (angle of incidence)}}$$

The coplanarity of printed wiring board 68 is defined as the distance between its highest and lowest points. Thus, coplanarity is determined by the greatest measurement of coplanarity difference measured at the pads 68.

Using the measurement technique shown in FIGS. 9 and 10, conventional equipment such as a microscope can be used to measure coplanarity of a densely packed circuit assembly. This technique is effective, simple, and inexpensive. Printed wiring board 68 can be mounted on a hot or cold surface plate to measure coplanarity at hot or cold temperatures, as desired.

Throughout the description of the invention, measurements of pads on a printed wiring board and solder balls (or columns) on a BGA package are interchangeable, since the method to measure coplanarity of both structures is substantially identical.

Although the present invention has been described with reference to preferred embodiments, workers skilled in the art will recognize that changes may be made in form and detail without departing from the spirit and scope of the invention.

What is claimed is:

1. A process of measuring coplanarity of an array of conductive elements on a circuit device, comprising the steps of:
   (a) impinging light from a reference plane onto an element of the array at a predetermined angle of incidence,
   (b) impinging light from the reference plane onto a reflective feature on a measurement plane determined by three points of the circuit device having highest elevations from a base of the circuit device, at the predetermined angle of incidence, wherein the reflective feature on the measurement plane is realized by placing a plate composed of transculent portions and at least one reflective portion on the array of conductive elements on the circuit device; and
   (c) measuring a response of the light impinged onto the element of the array and the reflective feature on the measurement plane.

2. The process of claim 1, wherein the circuit device is a grid array, and the array of conductive elements is comprised of solder balls.

3. The process of claim 1, wherein the circuit device is a printed wiring board and the array of conductive elements is comprised of conductive pads.

4. The process of claim 1, wherein the reflective feature on the measurement plane is one of a plurality of reflective features realized by placing the plate composed of reflective portions and translucent portions on the array of conductive elements on the circuit device.

5. The process of claim 4, wherein the reflective feature on the measurement plane is selected so as to be a closest one of the reflective portions to the element of the array that light is impinged upon.

6. The process of claim 1, wherein the predetermined angle of incidence is 90°.

7. A process of measuring coplanarity of an array of conductive elements on a circuit device, comprising the steps of:
   impinging light from a reference plane onto an element of the array at a predetermined angle of incidence;
   impinging light from the reference plane onto a reflective feature on a measurement plane determined by three points of the circuit device having highest elevations from a base of the circuit device, at the predetermined angle of incidence;
   measuring a first distance between the reference plane and the element of the array;
   measuring a second distance between the reference plane and the reflective feature on the measurement plane; and
   subtracting the second distance from the first distance.

8. The process of claim 7, wherein the predetermined angle of incidence is 90°.

9. A process of measuring coplanarity of an array of conductive elements on a circuit device, comprising the steps of:
   impinging light from a reference plane onto an element of the array at a predetermined angle of incidence;
   impinging light from the reference plane onto a reflective feature on a measurement plane determined by three points of the circuit device having highest elevations from a base of the circuit device, at the predetermined angle of incidence;
   detecting at a target reflections of the light impinged onto the element of the array and of the light impinged onto the reflective feature on the measurement plane;
   measuring at the target a distance between the reflection of the light impinged onto the element of the array and the reflection of the light impinged onto the reflective feature on the measurement plane; and
   dividing the distance between the reflection of the light impinged onto the element of the array and the reflection of the light impinged onto the reflective feature on the measurement plane by the cosine of the angle of incidence.

10. A process of measuring coplanarity of an array of conductive elements on a circuit device, comprising the steps of:
   (a) impinging a first light beam at a predetermined angle of incidence from a reference plane onto an element of the array on the circuit device;

(b) impinging a second light beam at the predetermined angle of incidence from the reference plane to a reflective feature on a plane determined by three points of the circuit device having highest elevations from a base of the circuit device;

(c) detecting at a target reflections of the first and second light beams;

(d) measuring at the target a distance between the reflections of the first and second light beams; and (e) dividing the distance between the reflections of the first and second light beams by the cosine of the angle of incidence.

11. The process of claim 10, wherein the circuit device is a grid array, and the array of conductive elements is comprised of solder balls.

12. The process of claim 10, wherein the circuit device is a printed wiring board and the array of conductive elements is comprised of conductive pads.

13. A process of measuring coplanarity of an array of conductive elements on a circuit device comprising the steps of:

(a) placing a plate composed of reflective portions and translucent portions on the array of conductive elements on the circuit device;

(b) measuring a first distance from a reference plane to an element of the array through a translucent portion of the plate;

(c) measuring a second distance form the reference plane to a reflective portion of the plate; and (d) subtracting the second distance from the first distance.

14. The process of claim 13 wherein the reflective portion of the plate used to measure the second distance is that reflective portion closest to the element of the array used to measure the first distance.

15. The process of claim 13, wherein the circuit device is a ball grid array, and the array of conductive elements is comprised of solder balls.

16. The process of claim 13, wherein the circuit device is a printed wiring board and the array of conductive elements is comprised of conductive pads.

* * * * *